(12) United States Patent
Krishnan et al.

(10) Patent No.: US 10,167,571 B2
(45) Date of Patent: Jan. 1, 2019

(54) WAFER CARRIER HAVING PROVISIONS FOR IMPROVING HEATING UNIFORMITY IN CHEMICAL VAPOR DEPOSITION SYSTEMS

(71) Applicant: Veeco Instruments, Inc., Plainview, NY (US)

(72) Inventors: Sandeep Krishnan, Jersey City, NJ (US); William E. Quinn, Whitehouse Station, NJ (US); Jeffery S. Montgomery, East Brunswick, NJ (US); Joshua Mangum, Sarasota, FL (US); Lukas Urban, Boulder, CO (US)

(73) Assignee: Veeco Instruments Inc., Plainview, NY (US)

( * ) Notice: Subject to any disclaimer, the term of this patent is extended or adjusted under 35 U.S.C. 154(b) by 860 days.

(21) Appl. No.: 13/840,164

(22) Filed: Mar. 15, 2013

(65) Prior Publication Data

US 2014/0261187 A1    Sep. 18, 2014

(51) Int. Cl.
*C30B 25/12* (2006.01)
*B23P 19/04* (2006.01)
(Continued)

(52) U.S. Cl.
CPC .............. *C30B 25/12* (2013.01); *B23P 19/04* (2013.01); *C23C 16/4584* (2013.01);
(Continued)

(58) Field of Classification Search
USPC ......................................... 118/730, 728, 729
See application file for complete search history.

(56) References Cited

U.S. PATENT DOCUMENTS

| 3,754,110 A | 8/1973 | van Dongen et al. |
| 3,892,940 A | 7/1975 | Bloem et al. |

(Continued)

FOREIGN PATENT DOCUMENTS

| EP | 1 615 259 A1 | 1/2006 |
| EP | 1 720 200 A1 | 11/2006 |

(Continued)

OTHER PUBLICATIONS

Machine Generated English Translation of KR20120090676A. Published Aug. 2012.*

(Continued)

*Primary Examiner* — Sylvia MacArthur
(74) *Attorney, Agent, or Firm* — Patterson Thuente Pedersen, P.A.

(57) ABSTRACT

A wafer carrier and methods of making the same for use in a system for growing epitaxial layers on one or more wafers by chemical vapor deposition. The wafer carrier includes wafer retention pockets recessed in its body. A thermally-insulating spacer is situated at least partially in the at least one wafer retention pocket and arranged to maintain a spacing between the peripheral wall surface and the wafer, the spacer being constructed from a material having a thermal conductivity less than a thermal conductivity of the wafer carrier such that the spacer limits heat conduction from portions of the wafer carrier body to the wafer. The wafer carrier further includes a spacer retention feature that engages with the spacer and includes a surface oriented to prevent centrifugal movement of the spacer when subjected to rotation about the central axis.

20 Claims, 14 Drawing Sheets

(51) Int. Cl.
*H01L 21/687* (2006.01)
*C23C 16/458* (2006.01)

(52) U.S. Cl.
CPC .... *C23C 16/4585* (2013.01); *H01L 21/68728* (2013.01); *H01L 21/68735* (2013.01); *H01L 21/68764* (2013.01); *H01L 21/68771* (2013.01); *Y10T 29/49826* (2015.01)

(56) References Cited

U.S. PATENT DOCUMENTS

| | | | |
|---|---|---|---|
| 3,993,018 | A | 11/1976 | Kranik et al. |
| 4,512,841 | A | 4/1985 | Cunningham, Jr. et al. |
| 4,898,639 | A | 2/1990 | Moe et al. |
| 5,119,541 | A | 6/1992 | Ohmi et al. |
| 5,155,652 | A | 10/1992 | Logan et al. |
| 5,195,729 | A | 3/1993 | Thomas et al. |
| 5,242,501 | A | 9/1993 | McDiarmid |
| 5,403,401 | A | 4/1995 | Haafkens et al. |
| 5,531,835 | A | 7/1996 | Fodor et al. |
| 5,556,476 | A | 9/1996 | Lei et al. |
| 5,626,678 | A | 5/1997 | Sahin et al. |
| 5,761,023 | A | 6/1998 | Lue et al. |
| 5,800,622 | A | 9/1998 | Takemi et al. |
| 5,820,686 | A | 10/1998 | Moore |
| 5,837,058 | A | 11/1998 | Chen et al. |
| 5,840,124 | A * | 11/1998 | Gurary .................. C30B 25/12 118/726 |
| 6,001,183 | A * | 12/1999 | Gurary ................ C23C 16/4584 118/720 |
| 6,074,696 | A | 6/2000 | Sato |
| 6,092,623 | A | 7/2000 | Collavino |
| 6,126,382 | A | 10/2000 | Scales et al. |
| 6,146,464 | A | 11/2000 | Beinglass et al. |
| 6,188,838 | B1 | 2/2001 | Mikata et al. |
| 6,287,386 | B1 | 9/2001 | Perlov et al. |
| 6,375,741 | B2 | 4/2002 | Reardon et al. |
| 6,391,802 | B1 | 5/2002 | Delpech et al. |
| 6,454,865 | B1 | 9/2002 | Goodman et al. |
| 6,492,625 | B1 | 12/2002 | Boguslavskiy et al. |
| 6,506,252 | B2 | 1/2003 | Boguslavskiy et al. |
| 6,634,882 | B2 | 10/2003 | Goodman |
| 6,685,774 | B2 | 2/2004 | Boguslayskiy et al. |
| 6,726,769 | B2 | 4/2004 | Boguslayskiy et al. |
| 6,729,875 | B2 | 5/2004 | Goodman |
| 6,840,767 | B2 | 1/2005 | Goodman |
| 6,902,623 | B2 | 6/2005 | Gurary et al. |
| 7,070,660 | B2 | 7/2006 | Keeton et al. |
| 7,235,139 | B2 | 6/2007 | Boguslavskiy et al. |
| 7,256,375 | B2 | 8/2007 | Oosterlaken |
| 7,276,124 | B2 | 10/2007 | Gurary et al. |
| 7,279,048 | B2 | 10/2007 | Shinma et al. |
| 7,331,780 | B2 | 2/2008 | Adachi |
| D600,221 | S | 9/2009 | Sato |
| D600,222 | S | 9/2009 | Sato |
| 7,601,224 | B2 | 10/2009 | Foree |
| 7,625,205 | B2 | 12/2009 | Sasamjima et al. |
| 7,959,735 | B2 | 6/2011 | Sterling et al. |
| 8,021,487 | B2 | 9/2011 | Boguslavskiy et al. |
| 8,092,599 | B2 | 1/2012 | Sferlazzo et al. |
| 8,372,204 | B2 | 2/2013 | Nakamura et al. |
| 9,017,483 | B2 | 4/2015 | Fujikawa et al. |
| 2002/0018506 | A1 | 2/2002 | Vogler |
| 2002/0106826 | A1 | 8/2002 | Boguslayskiy et al. |
| 2002/0185062 | A1 | 12/2002 | Halpin |
| 2002/0197144 | A1 | 12/2002 | Blank et al. |
| 2003/0089457 | A1 | 5/2003 | Nallan et al. |
| 2004/0011293 | A1 | 1/2004 | Johnson et al. |
| 2004/0011780 | A1 | 1/2004 | Sun et al. |
| 2004/0187790 | A1 | 9/2004 | Bader et al. |
| 2005/0051099 | A1 | 3/2005 | Preti et al. |
| 2006/0076108 | A1 | 4/2006 | Holland et al. |
| 2006/0115968 | A1 | 6/2006 | Funk |
| 2006/0180076 | A1 | 8/2006 | Kanaya et al. |
| 2006/0191483 | A1 | 8/2006 | Blomiley et al. |
| 2006/0245906 | A1 * | 11/2006 | Pelzmann ......... H01L 21/67109 414/744.8 |
| 2007/0026148 | A1 | 2/2007 | Arai et al. |
| 2007/0186853 | A1 | 8/2007 | Gurary et al. |
| 2007/0218664 | A1 | 9/2007 | Ito et al. |
| 2008/0124470 | A1 | 5/2008 | Van Den Berg et al. |
| 2009/0155028 | A1 | 6/2009 | Boguslavskiy et al. |
| 2009/0162952 | A1 | 6/2009 | Liu et al. |
| 2010/0055318 | A1 * | 3/2010 | Volf .................... C23C 16/4584 427/255.28 |
| 2010/0116210 | A1 | 5/2010 | Kato et al. |
| 2010/0282170 | A1 | 11/2010 | Nishizawa |
| 2011/0049779 | A1 * | 3/2011 | Egami ................ C23C 16/4583 269/289 R |
| 2011/0129947 | A1 * | 6/2011 | Mangum ................ H01L 22/20 438/14 |
| 2011/0206843 | A1 * | 8/2011 | Gurary .............. C23C 16/45521 427/248.1 |
| 2012/0040097 | A1 | 2/2012 | Volf et al. |
| 2012/0309191 | A1 | 12/2012 | Miura |
| 2013/0065403 | A1 * | 3/2013 | Paranjpe ............ C23C 16/4584 438/758 |
| 2013/0092595 | A1 | 4/2013 | Chang et al. |
| 2013/0186113 | A1 | 7/2013 | Chung et al. |
| 2013/0276704 | A1 | 10/2013 | Krishnan et al. |
| 2014/0261187 | A1 * | 9/2014 | Krishnan ............ C23C 16/4584 118/730 |
| 2014/0287142 | A1 | 9/2014 | Boyd et al. |
| 2014/0360430 | A1 | 12/2014 | Armour et al. |
| 2015/0118009 | A1 | 4/2015 | Hsieh et al. |

FOREIGN PATENT DOCUMENTS

| | | |
|---|---|---|
| EP | 1965412 | 9/2008 |
| EP | 708477 | 1/2013 |
| JP | 60-173852 A | 9/1985 |
| JP | S63-096912 A | 4/1988 |
| JP | 01-256118 A | 10/1989 |
| JP | 04-123265 A | 4/1992 |
| JP | 05029230 | 2/1993 |
| JP | H5-275355 A | 10/1993 |
| JP | 5-335253 A | 12/1993 |
| JP | 6-010140 A | 1/1994 |
| JP | 7-074114 A | 3/1995 |
| JP | 10-060674 A | 3/1998 |
| JP | 10-087394 A | 4/1998 |
| JP | 10144758 A | 5/1998 |
| JP | 10-167885 A | 6/1998 |
| JP | 10-167886 A | 6/1998 |
| JP | 2000-355766 A | 12/2000 |
| JP | 2001-126995 A | 5/2001 |
| JP | 2003-037071 A | 2/2003 |
| JP | 2004-128271 A | 4/2004 |
| JP | 2004-327761 A | 11/2004 |
| JP | 2005-136025 A | 5/2005 |
| JP | 2005232488 | 9/2005 |
| JP | 2007-251078 A | 9/2007 |
| JP | 2009088088 A | 4/2009 |
| JP | 2010028013 A | 2/2010 |
| KR | 10-2007-0019689 A | 2/2007 |
| KR | 20120090676 A * | 8/2012 ....... H01L 21/68771 |
| WO | WO 2001/007691 A1 | 2/2001 |
| WO | WO 2005/081298 A1 | 9/2005 |
| WO | WO 2006/088448 A1 | 8/2006 |
| WO | WO 2007/105877 A1 | 9/2007 |
| WO | WO 2007/122147 A1 | 11/2007 |
| WO | WO2014062000 | 4/2014 |
| WO | WO2014062002 | 4/2014 |

OTHER PUBLICATIONS

Taiwanese Office Action for Taiwanese Application No. 103204332 dated Oct. 3, 2014, English translation not provided.
International Search Report and Written Opinion for International Application No. PCT/US2014/027773 dated Jul. 28, 2014.
European Patent Application No. EP14762924.0, Partial Supplementary EP Search Report dated Oct. 17, 2016, 7 pages.

(56) References Cited

OTHER PUBLICATIONS

EP Application No. 14762924.0, Extended European Search Report dated Feb. 17, 2017, 12 pages.
CN Application No. 201480015658.8, First Office Action, dated Apr. 1, 2017, 13 pages.
TW Application No. 103109201, Office Action, dated Aug. 28, 2017, 4 pages.
Application and File History for U.S. Appl. No. 13/450,062, filed Apr. 18, 2012, Inventors Krishnan et al.
Application and File History for U.S. Appl. No. 12/549,768, filed Apr. 18, 2012, Inventors Krishnan et al.
European Application No. 12193897.1, European Extended Search Report dated Sep. 15, 2016.
European Application No. 121938989, European Extended Search Report dated Dec. 13, 2012.
European Application No. 09810392, Supplemental Search Report dated Apr. 5, 2012.
U.S. Appl. No. 61/237,948, filed Aug. 28, 2009, Egami et al.
Int'l Application No. PCT/US09/04931 Search Report dated Apr. 15, 2010.

* cited by examiner

Section 3-3

Section 10-10

WAFER CARRIER HAVING PROVISIONS FOR IMPROVING HEATING UNIFORMITY IN CHEMICAL VAPOR DEPOSITION SYSTEMS

FIELD OF THE INVENTION

The invention relates generally to semiconductor fabrication technology and, more particularly, to chemical vapor deposition (CVD) processing and associated apparatus for reducing temperature non-uniformities on semiconductor wafer surfaces.

BACKGROUND OF THE INVENTION

In the fabrication of light-emitting diodes (LEDs) and other high-performance devices such as laser diodes, optical detectors, and field effect transistors, a chemical vapor deposition (CVD) process is typically used to grow a thin film stack structure using materials such as gallium nitride over a sapphire or silicon substrate. A CVD tool includes a process chamber, which is a sealed environment that allows infused gases to be deposited upon the substrate (typically in the form of wafers) to grow the thin film layers. An example of a current product line of such manufacturing equipment is the TurboDisc® family of MOCVD systems, manufactured by Veeco Instruments Inc. of Plainview, N.Y.

A number of process parameters are controlled, such as temperature, pressure and gas flow rate, to achieve a desired crystal growth. Different layers are grown using varying materials and process parameters. For example, devices formed from compound semiconductors such as III-V semiconductors typically are formed by growing successive layers of the compound semiconductor using metal organic chemical vapor deposition (MOCVD). In this process, the wafers are exposed to a combination of gases, typically including a metal organic compound as a source of a group III metal, and also including a source of a group V element which flow over the surface of the wafer while the wafer is maintained at an elevated temperature. Typically, the metal organic compound and group V source are combined with a carrier gas which does not participate appreciably in the reaction as, for example, nitrogen. One example of a III-V semiconductor is gallium nitride, which can be formed by reaction of an organo-gallium compound and ammonia on a substrate having a suitable crystal lattice spacing, as for example, a sapphire wafer. Typically, the wafer is maintained at a temperature on the order of 1000-1100° C. during deposition of gallium nitride and related compounds.

In a MOCVD process, where the growth of crystals occurs by chemical reaction on the surface of the substrate, the process parameters must be controlled with particular care to ensure that the chemical reaction proceeds under the required conditions. Even small variations in process conditions can adversely affect device quality and production yield. For instance, if a gallium and indium nitride layer is deposited, variations in wafer surface temperature will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary to an unacceptable degree.

In a MOCVD process chamber, semiconductor wafers on which layers of thin film are to be grown are placed on rapidly-rotating carousels, referred to as wafer carriers, to provide a uniform exposure of their surfaces to the atmosphere within the reactor chamber for the deposition of the semiconductor materials. Rotation speed is on the order of 1,000 RPM. The wafer carriers are typically machined out of a highly thermally conductive material such as graphite, and are often coated with a protective layer of a material such as silicon carbide. Each wafer carrier has a set of circular indentations, or pockets, in its top surface in which individual wafers are placed. Typically, the wafers are supported in spaced relationship to the bottom surface of each of the pockets to permit the flow of gas around the edges of the wafer. Some examples of pertinent technology are described in U.S. Patent Application Publication No. 2012/0040097, U.S. Pat. No. 8,092,599, U.S. Pat. No. 8,021,487, U.S. Patent Application Publication No. 2007/0186853, U.S. Pat. No. 6,902,623, U.S. Pat. No. 6,506,252, and U.S. Pat. No. 6,492,625, the disclosures of which are incorporated by reference herein.

The wafer carrier is supported on a spindle within the reaction chamber so that the top surface of the wafer carrier having the exposed surfaces of the wafers faces upwardly toward a gas distribution device. While the spindle is rotated, the gas is directed downwardly onto the top surface of the wafer carrier and flows across the top surface toward the periphery of the wafer carrier. The used gas is evacuated from the reaction chamber through ports disposed below the wafer carrier. The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution device typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers. Also, the heat transferred upwards through the carrier material is radiated from the top surface of the wafer carrier. The degree of radiative emission from the wafer carrier is determined by the emissivity of the carrier and the surrounding components.

A great deal of effort has been devoted to system design features to minimize temperature variations during processing; however, the problem continues to present many challenges. For instance, wafers are significantly less thermally conductive than the wafer carrier. Introducing a sapphire wafer in a pocket of the wafer carrier creates a heat-trapping, or "blanketing" effect. This phenomenon results in a generally radial thermal profile at the pocket floor which is hotter in the center and lower temperature towards the outer radius of the pocket, where the heat can be emitted by radiation and convection into the environment.

Another effect that impacts thermal uniformity of the wafers in-process is the thermal gradient across the thickness of the wafer, which causes a concave bow, resulting in a non-uniform gap distance between the wafer bottom and pocket floor. This is because the hotter bottom of the wafer tends to expand more in relation to the colder top surface, thereby assuming a classical concave shape. The concave bow will generally add to the thermal non-uniformity that already exists on the wafer due to thermal blanketing effects. Due to the very small thermal conductance of the gas gap compared to the carrier material, the wafer surface temperature is extremely sensitive to changes in the gap magnitude. In the case of a concave bow, the center of the wafer will be closer to the pocket floor, and consequently hotter compared to the outer edges. This effect is more pronounced in larger-diameter wafers, which are typically made from silicon. Also, with silicon wafers in particular, the bowing is further aggravated by film stresses from a crystal lattice mismatch between the silicon substrate and the deposited layers used to fabricate the devices on the substrate.

A related thermal conduction transfer process also occurs in the lateral direction from wafer carrier pocket edge to the wafer edge, depending upon this distance. In CVD tools utilizing a high-speed rotating wafer carrier, the wafers are typically driven towards the outer edge of the pockets due to high centrifugal forces. Thus, these wafers are in typically in contact with the outer pocket edge. The non-concentric position of a wafer in the pocket creates a non-uniform gap from the pocket edge that is zero at the point of contact, and increases circumferentially away from the contact point. The smaller gap between the wafer and carrier in regions close to the point of contact increases the conductive heat transfer from the carrier to the wafer. This "close proximity" effect results in much higher edge temperatures in the region of contact. Co-pending U.S. patent application Ser. No. 13/450,062, the disclosure of which is incorporated by reference herein, describes approaches for reducing the proximity effect utilizing "bumpers" to center the wafer at a prescribed distance from the pocket edge. These bumpers have been shown to be successful in virtually eliminating the high temperature crescent generated by the proximity effect. However, several practical challenges remain, particularly Another challenge in maintaining temperature uniformity over the wafers relates to the wafers, which are typically circular, flat discs, having one or more straight portions of their edge commonly referred to as "flats." Flats are generally used to indicate the doping type of the wafer, as well as the crystallographic orientation of the wafer, and are typically found on wafers smaller than 200 mm. In CVD processing, however, the flats present a non-uniformity for heat transfer to the wafer. In particular, the heat transfer to the portion of the wafer near the flat tends to be reduced due to the separation between the edge of the wafer flat and the wafer carrier. Also, the flat introduces a variation in gas flow that also affects the temperature in the vicinity of the flat.

A further concern relates to multi-wafer pocket geometries with non-concentric pocket locations. Here, the thermal profile becomes more complicated as the convective cooling is dependent upon the historical gas streamline path passing over both the wafer carrier and wafer regions. For high-speed rotating disc reactors, the gas streamlines spiral outward from inner to outer radius in a generally tangential direction. In this case, when the gas streamline is passing over the exposed portion of the wafer carrier (such as the regions of "webs" between the wafers), it is heated up relative to the regions where it is passing over the wafers. In general, these webs are quite hot relative to the other regions of the carrier where the wafers are situated, as the heat flux streamlines due to the blanketing effect have channeled the streamlines into this region. Thus, the gas paths passing over the webs create a tangential gradient in temperature due to the convective cooling, which is hotter at the leading edge (entry of the fluid streamline to the wafer) relative to the trailing edge (exit of the fluid streamline over the wafer).

These effects contribute to a reduced product yield since devices fabricated from portions of the wafer near the flat tend to exhibit increased photoluminescence relative to the target value for the rest of the wafer. Solutions are needed that addresses one or more of these, and related, challenges in improving wafer heating uniformity in CVD reactors.

SUMMARY OF THE INVENTION

Aspects of the invention are directed to a chemical vapor deposition (CVD) system in which thermal non-uniformities along the edges of the wafers are significantly reduced. In one aspect, a wafer carrier has a body formed symmetrically about a central axis, and including a generally planar top surface that is situated perpendicularly to the central axis. At least one wafer retention pocket is recessed in the wafer carrier body from the top surface. Each one wafer retention pocket includes a floor surface and a peripheral wall surface that surrounds the floor surface and defines a periphery of that wafer retention pocket, the wafer retention pocket is adapted to retain a wafer within the periphery when subjected to rotation about the central axis. A thermally-insulating spacer is situated at least partially in the at least one wafer retention pocket and arranged to maintain a spacing between the peripheral wall surface and the wafer. The spacer is constructed from a material having a thermal conductivity less than a thermal conductivity of the wafer carrier body such that the spacer limits heat conduction from portions of the wafer carrier body to the wafer. A spacer retention feature is formed in the wafer carrier body that engages with the spacer and includes a surface oriented to prevent centrifugal movement of the spacer when subjected to rotation about the central axis.

In another aspect of the invention, a method is provided for forming the wafer carrier. In the method, a wafer carrier body is formed that is symmetric about a central axis. A generally planar top surface is formed in the body that is situated perpendicularly to the central axis. A plurality of wafer retention pockets are formed, with each of the pockets being recessed in the body from the top surface. In the pockets there is a floor surface and a peripheral wall surface that surrounds the floor surface and defines a periphery of that wafer retention pocket. The wafer retention pocket is adapted to retain a wafer within the periphery when subjected to rotation about the central axis.

The method further comprises situating a thermally-insulating spacer at least partially in the at least one wafer retention pocket to maintain a spacing between the peripheral wall surface and the wafer. The spacer is constructed from a material having a thermal conductivity less than a thermal conductivity of the wafer carrier body such that the spacer limits heat conduction from portions of the wafer carrier body to the wafer. A spacer retention feature is formed in the wafer carrier body such that the spacer retention feature engages with the spacer and provides a surface oriented to prevent centrifugal movement of the spacer when subjected to rotation about the central axis.

In related aspects of the invention, the wafer carrier is part of an apparatus for growing epitaxial layers on one or more wafers by chemical vapor deposition that includes a reaction chamber, a rotatable spindle having an upper end disposed inside the reaction chamber, where the wafer carrier is centrally and detachably mounted on an upper end of the spindle and is in contact therewith at least in the course of a CVD process.

BRIEF DESCRIPTION OF THE DRAWINGS

The invention may be more completely understood in consideration of the following detailed description of various embodiments of the invention in connection with the accompanying drawings, in which.

Figure 1:
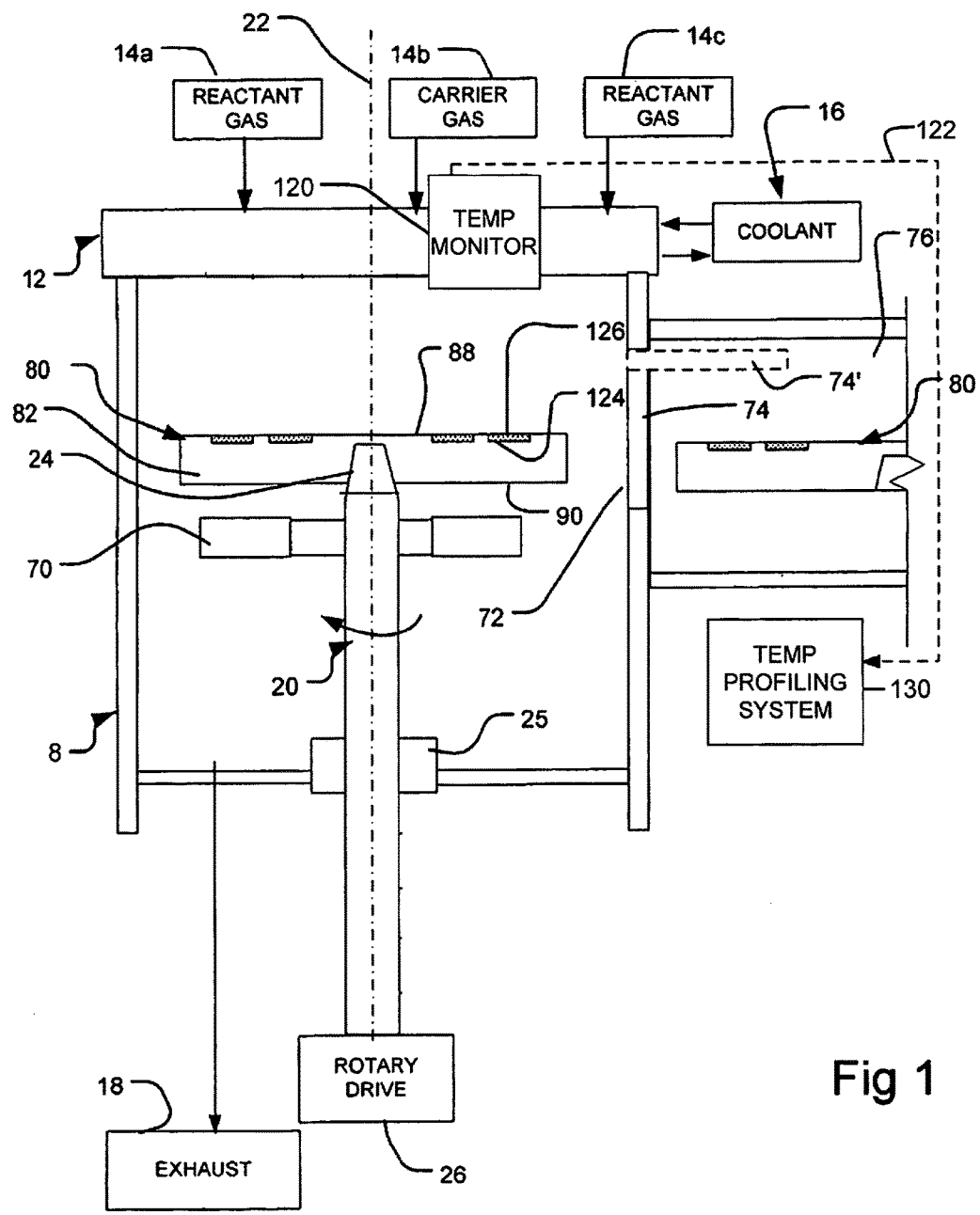
FIG. 1 illustrates a chemical vapor deposition apparatus in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

FIG. 1 illustrates a chemical vapor deposition apparatus in accordance with one embodiment of the invention. A reaction chamber 8 defines a process environment space. A gas distribution device 12 is arranged at one end of the chamber. The end having the gas distribution device 12 is referred to herein as the "top" end of the chamber 8. This end of the chamber typically, but not necessarily, is disposed at the top of the chamber in the normal gravitational frame of reference. Thus, the downward direction as used herein refers to the direction away from the gas distribution device 12; whereas the upward direction refers to the direction within the chamber, toward the gas distribution device 12, regardless of whether these directions are aligned with the gravitational upward and downward directions. Similarly, the "top" and "bottom" surfaces of elements are described herein with reference to the frame of reference of chamber 8 and gas distribution device 12.

Gas distribution device 12 is connected to sources 14a, 14b, 14c for supplying process gases to be used in the wafer treatment process, such as a carrier gas and reactant gases such as a metalorganic compound and a source of a group V metal. The gas distribution device 12 is arranged to receive the various gases and direct a flow of process gasses generally in the downward direction. The gas distribution device 12 desirably is also connected to a coolant system 16 arranged to circulate a liquid through the gas distribution device so as to maintain the temperature of the gas distribution device at a desired temperature during operation. A similar coolant arrangement (not shown) can be provided for cooling the walls of chamber 8. Chamber 8 is also equipped with an exhaust system 18 arranged to remove spent gases from the interior of the chamber through ports (not shown) at or near the bottom of the chamber so as to permit continuous flow of gas in the downward direction from the gas distribution device.

A spindle 20 is arranged within the chamber so that the central axis 22 of the spindle extends in the upward and downward directions. The spindle is mounted to the chamber by a conventional rotary pass-through device 25 incorporating bearings and seals (not shown) so that the spindle can rotate about axis 22, while maintaining a seal between the spindle and the wall of chamber 8. The spindle has a fitting 24 at its top end, i.e., at the end of the spindle closest to the gas distribution device 12. As further discussed below, fitting 24 is an example of a wafer carrier retention mechanism adapted to releasably engage a wafer carrier. In the particular embodiment depicted, the fitting 24 is a generally frustoconical element tapering toward the top end of the spindle and terminating at a flat top surface. A frustoconical element is an element having the shape of a frustum of a cone. Spindle 20 is connected to a rotary drive mechanism 26 such as an electric motor drive, which is arranged to rotate the spindle about axis 22.

A heating element 70 is mounted within the chamber and surrounds spindle 20 below fitting 24. The chamber is also provided with an entry opening 72 leading to an antechamber 76, and a door 74 for closing and opening the entry opening. Door 74 is depicted only schematically in FIG. 1. and is shown as movable between the closed position shown in solid lines, in which the door isolates the interior of chamber 8 from antechamber 76, and an open position shown in broken lines at 74'. The door 74 is equipped with an appropriate control and actuation mechanism for moving it between the open position and closed positions. In practice, the door may include a shutter movable in the upward and downward directions as disclosed, for example, in U.S. Pat. No. 7,276,124, the disclosure of which is hereby incorporated by reference herein. The apparatus depicted in FIG. 1 may further include a loading mechanism (not shown) capable of moving a wafer carrier from the antechamber 76 into the chamber and engaging the wafer carrier with the spindle in the operative condition, and also capable of moving a wafer carrier off of the spindle and into antechamber 76.

Figure 2:
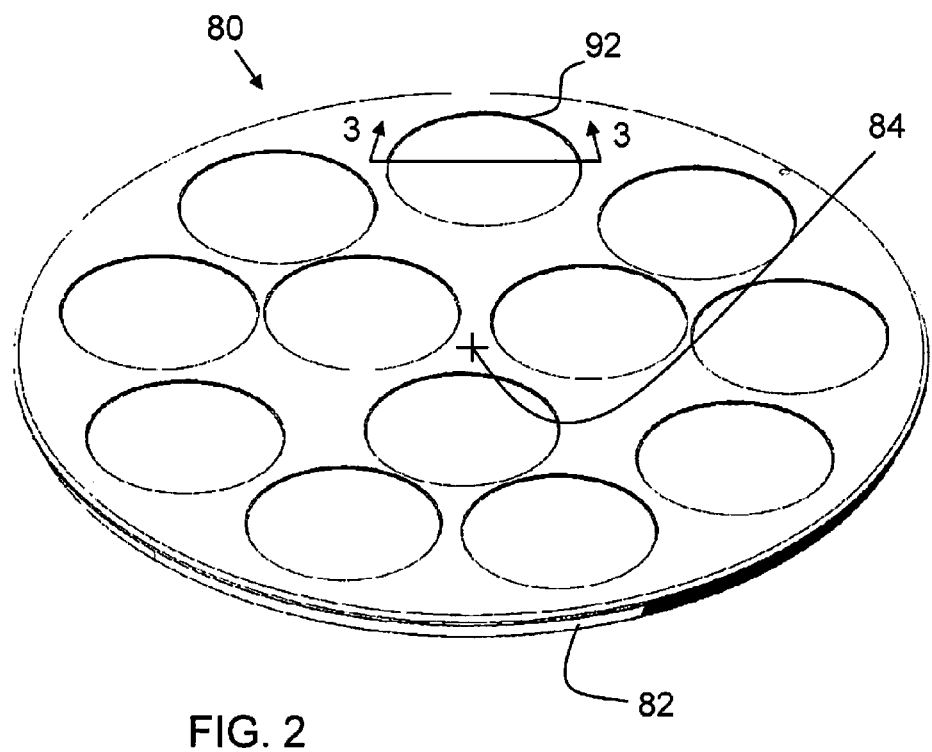
FIG. 2 is a schematic diagram illustrating a wafer carrier from a perspective view used with the apparatus of FIG. 1 according to one embodiment of the invention.

The apparatus also includes a plurality of wafer carriers 80. In the operating condition shown in FIG. 1, a first wafer carrier 80 is disposed inside chamber 8 in an operative position, whereas a second wafer carrier 80 is disposed within antechamber 76. Each wafer carrier 80 includes a body 82 which is substantially in the form of a circular disc having a central axis 84 (FIG. 2). The body 82 is formed symmetrically about central axis 84. In the operative position the central axis 84 of the wafer carrier body is coincident with the axis 22 of the spindle. The body 82 may be formed as a single piece or as a composite of plural pieces. For example, as disclosed in U.S. Patent Application Pub. No. 20090155028, the disclosure of which is hereby incorporated by reference herein, the wafer carrier body may include a hub defining a small region of the body surrounding the central axis 84 and a larger portion defining the remainder of the disc-like body. The body desirably is formed from materials which do not contaminate the process and which can withstand the temperatures encountered in the process. For example, the larger portion of the disc may be formed largely or entirely from materials such as graphite, silicon carbide, or other refractory materials. The body has a generally planar top surface 88 and a bottom surface 90 extending generally parallel to one another and generally perpendicular to the central axis 84 of the disc. The body also has one, or a plurality, of wafer-holding features adapted to hold a plurality of wafers.

In operation, a wafer 124, such as a disc-like wafer formed from sapphire, silicon carbide, or other crystalline substrate, is disposed within each pocket 90 of each wafer carrier 80. Typically, the wafer 124 has a thickness which is small in comparison to the dimensions of its major surfaces. For example, a circular wafer of about 2 inches (50 mm) in diameter may be about 430 µm thick or less. As illustrated in FIG. 1, the wafer is disposed with a top surface 126 facing upwardly, so that the top surface is exposed at the top of the wafer carrier. It should be noted that in various embodiments, wafer carrier 80 carries different quantities of wafers. For instance, in one example embodiment, the wafer carrier is adapted to hold six wafers. In another example embodiment, as shown in FIG. 2, wafer carrier 80 holds 12 wafers.

In a typical MOCVD process, a wafer carrier 80 with wafers loaded thereon is loaded from antechamber 76 into chamber 8 and placed in the operative position shown in FIG. 1. In this condition, the top surfaces of the wafers face upwardly, towards the gas inlet structure 12. Heater 70 is actuated, and the rotary drive mechanism 26 operates to turn spindle 20 and hence wafer carrier 80 around axis 22. Typically, the spindle is rotated at a rotational speed from about 50-1500 revolutions per minute. Process gas supply units 14a, 14b, and 14c are actuated to supply gases through the gas distribution device 12. The gases pass downwardly toward the wafer carrier 80, over the top surface 88 of the wafer carrier and the top surfaces 126 of the wafers, and downwardly around the periphery of the wafer carrier to the outlet and to exhaust system 18. Thus, the top surface of the wafer carrier and the top surfaces of the wafer are exposed to a process gas including a mixture of the various gases supplied by the various process gas supply units. Most typically, the process gas at the top surface is predominantly composed of the carrier gas supplied by carrier gas supply unit 14b. In a typical chemical vapor deposition process, the carrier gas may be nitrogen, and hence the process gas at the top surface of the wafer carrier is predominantly composed of nitrogen with some amount of the reactive gas components.

Heaters 70 transfer heat to the bottom surface 90 of the wafer carrier, principally by radiant heat transfer. The heat applied to the bottom surface of the wafer carrier flows upwardly through the body 82 of the wafer carrier to the top surface 88 of the wafer carrier. Heat passing upwardly through the body also passes upwardly through gaps to the bottom surface of each wafer, and upwardly through the wafer to the top surface 126 of the wafer. Heat is radiated from the top surface 88 of the wafer carrier and from the top surfaces 126 of the wafer to the colder elements of the process chamber as, for example, to the walls of the process chamber and to the gas distribution device 12. Heat is also transferred from the top surface 88 of the wafer carrier and the top surfaces 126 of the wafers to the process gas passing over these surfaces.

In the embodiment depicted, the system includes a number of features designed to determine uniformity of heating of the surfaces 126 of each wafer 124. In this embodiment, temperature profiling system 130 receives temperature information 122 that can include a temperature and temperature monitoring positional information from temperature monitor 120. In addition, temperature profiling system 130 receives wafer carrier positional information, which in one embodiment can come from rotary drive mechanism 26. With this information, temperature profiling system 130 constructs a temperature profile of the wafers 124 on wafer carrier 80. The temperature profile represents a thermal distribution on the surface 126 of each of the wafers 124.

Figure 3:
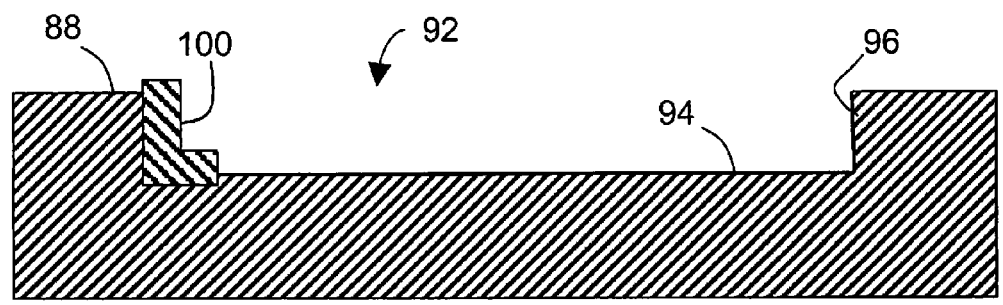
FIG. 3 is a cross-sectional view schematic diagram taken along line 3-3 detailing a wafer retention site, also referred to herein as a wafer pocket, of the wafer carrier depicted in FIGS. 1 and 2, and including a thermally-insulating spacer according to one aspect of the invention.

FIGS. 2 and 3 illustrate wafer carrier 80 in greater detail. Each wafer retention site is in the form of a generally circular recess, or pocket 92 extending downwardly into the body from the top surface 88. The generally circular shape is made to correspond to the shape of the wafers. Each pocket 92 has a floor surface 94 disposed below the surrounding portions of the top surface 88. Floor surface 94 can be flat (as shown), or it can be concave, convex, textured, etc. Each pocket also has a peripheral wall surface 96 surrounding the floor surface and defining the periphery of the pocket. The peripheral wall surface 96 extends downwardly from the top surface 88 of the body toward the floor surface. In various embodiments, the peripheral wall surface 96 can have an undercut where the wall slopes inwards, i.e., towards the center of the pocket, over at least a portion of the periphery. Thus, such a sloped the peripheral wall surface 96 would form an acute angle relative to floor surface 94. In one example embodiment, the angle formed between peripheral wall surface 96 and floor surface 94 is 80 degrees.

One aspect of the invention is directed to the addition of a thermally-insulating spacer, as partially illustrated in FIG. 3 at 100. Thermally-insulating spacer 100 can have a variety of structural arrangements according to various embodiments, several of which are detailed below. An important feature of spacer 100, in one type of embodiment, is that spacer 100 is constructed and situated so that it maintains a separation between the wafer which sits in pocket 92, and peripheral wall surface 94. In a related type of embodiment, spacer 100 also creates a space between the wafer and floor surface 94 by supporting the wafer at its edges at a height that is elevated relative to floor surface 94. Various structures of spacer 100 are contemplated to provide these functions, several of which are detailed below. In related embodiments, spacer 100 has features that help to retain wafers in their pockets during processing. For instance, one embodiment uses lateral extensions referred to herein as lips, which extend over parts of the top surface of the wafer, thereby preventing the wafer from lifting off its bottom support and being ejected from the pocket due to the massive centrifugal forces at high rotatational velocities.

Another feature of spacer 100 is its heat-insulating characteristic. Since heat transfer to the wafer occurs primarily from heat flowing though the body of wafer carrier 80, the thermally-insulating characteristic in the present context means that the thermal conductivity of spacer 100 is less than the thermal conductivity of wafer carrier 80. Thus, spacer 100 not only provides separation between the wafer and the peripheral (and, optionally, the floor) surfaces of the wafer carrier, but also spacer 100 limits the conductive heat transfer between the wafer carrier surface(s) and the outer edge of the wafer.

In one type of embodiment, when wafer carrier 80 is made primarily from graphite, spacer 100 is made from a ceramic material such as sapphire, quartz, aluminum nitride, silicon nitride, silicon carbide, silicon, gallium nitride, gallium arsenide, or other suitable material that can withstand applicable process temperatures, that has a suitable thermal expansion coefficient, and that has a thermal conductivity less than graphite.

In a related embodiment, wafer carrier 80 has one or more spacer retention features that are adapted to engage with each spacer 100. The spacer retention features according to various embodiments can have a variety of structures, though in an important aspect, certain embodiments of the spacer retention features are specifically constructed to retain the spacers 100 while subjected to process conditions involving lateral forces due to the rotation of wafer carrier 80. Notably, significant centrifugal forces are exerted by the wafer being forced in an outward radial direction from the central axis 84 against one or more of the spacers 100. This force, in turn, is opposed by the spacer and the spacer retention features of wafer carrier 80. According to one embodiment, the spacer and the spacer retention feature cooperate to form a bracing arrangement that locks the spacer in place in response to an applied centrifugal force along an outward radial direction from the central axis.

In another related embodiment, the spacer has an upper portion that laterally extends along the top surface of the wafer carrier in a direction away from the center of the pocket. This configuration advantageously provides heat insulating properties for the top surface of the wafer carrier that is not beneath a wafer, thereby improving heat flux uniformity within the wafer carrier body and, ultimately, the in-process heating uniformity of the wafers.

Figure 4:
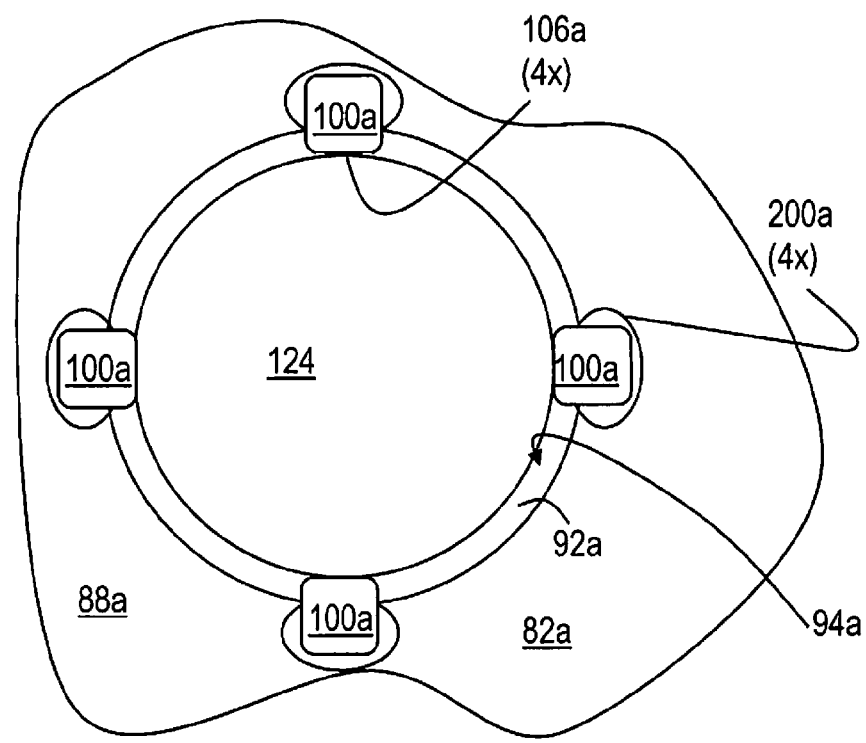
FIG. 4 is a schematic plan-view diagram that illustrates a wafer situated inside a wafer retention pocket, and further retained by spacers that are separate structures according to one embodiment.

FIG. 4 is a schematic plan-view diagram that illustrates wafer 24 situated inside wafer retention pocket 92$a$, and further retained by spacers 100$a$, which are separate spacer structures according to one embodiment. In this example, each of spacers 100$a$ is situated partially in wafer retention pocket (particularly, along the outer periphery of each pocket 92). Each spacer 100$a$ includes a wafer interface surface 106$a$. Also depicted schematically are spacer retention features 200$a$ that are formed in body 82$a$ of the wafer carrier as spacer retention recesses (defined by the surrounding material of body 82$a$), and in each of which at least a portion a spacers 100$a$ resides. In various embodiments, the spacer retention recesses are recessed into the top surface 88$a$ of the wafer carrier, into the floor surface 94$a$ of the wafer retention pocket, or both.

Figure 5:
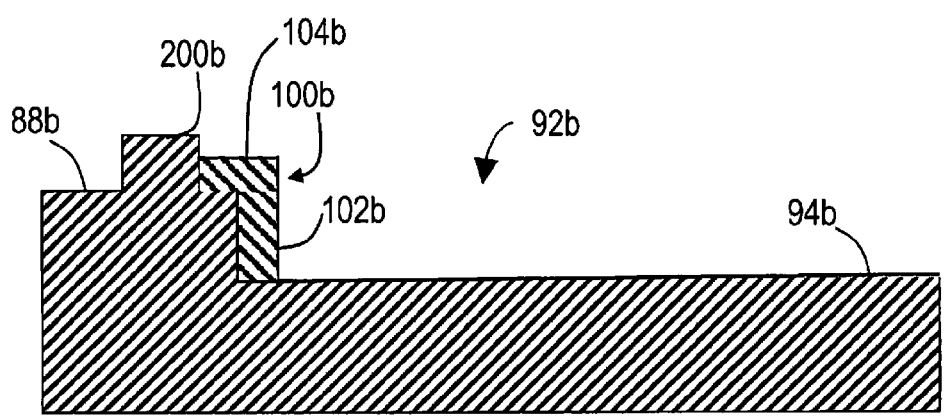
FIG. 5 is a schematic cross-sectional view diagram illustrating another exemplary arrangement in which a spacer is retained by a spacer retention feature.

FIG. 5 is a schematic cross-sectional view diagram illustrating another exemplary arrangement in which spacer 100$b$ is retained by spacer retention feature 200$b$. In this example, spacer retention feature 200$b$ protrudes upwards from top surface 88$b$ of the example wafer carrier, in which wafer retention pocket 92$b$ is defined having floor surface 94$b$, as depicted. Spacer 100$b$ has a first portion 102$b$ that extends downwards toward floor surface 94$b$, and a second portion that is situated over the top surface 88$b$.

Figure 6A:
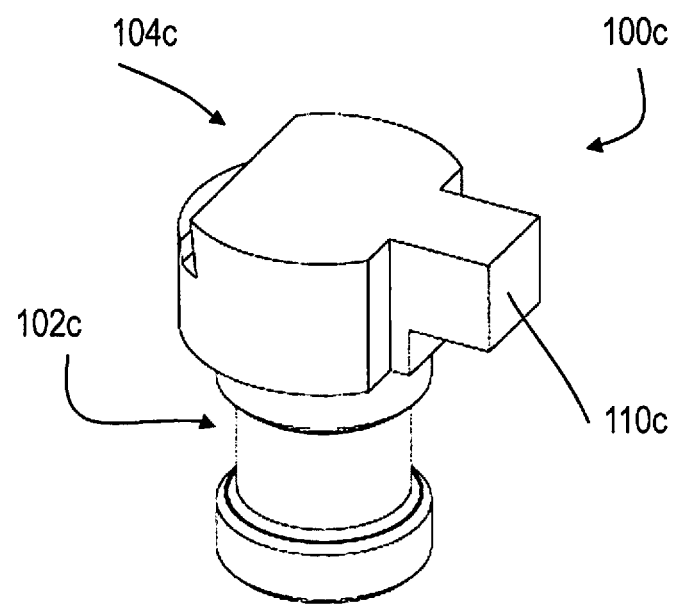
FIGS. 6A and 6B respectively depict another exemplary spacer that includes a post structure and a head structure.
Figure 6B:
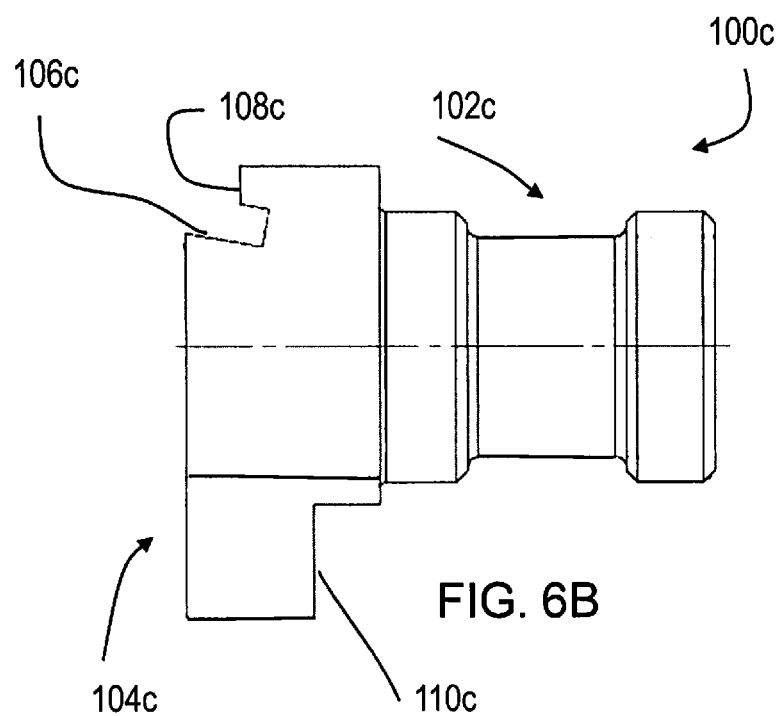

FIGS. 6A and 6B respectively depict another exemplary spacer, 100$c$ that includes a post structure 102$c$, and a head structure 104$c$. Post structure 102$c$ is designed to fit almost entirely within a spacer retention feature. Head structure 104$c$ is designed such that a portion thereof is inside the periphery of the wafer retention pocket, and includes a wafer edge interface surface 106$c$, and a wafer bottom support tab 108$c$. In one embodiment, as depicted, wafer edge interface surface 106$c$ is undercut (i.e., sloped inwards toward the wafer retention pocket center) in order to help lock the wafer in place when the wafer carrier is being used in-process. Wafer bottom support tab 108$c$ has a top surface that is situated higher than floor surface 94$c$ when spacer 100$c$ is installed. This arrangement permits wafer bottom support surface 108$c$ to retain the wafer in a spaced relationship relative to floor surface 94. In particular, in a process, gas may flow between the bottom of the wafer and floor surface 94. Head structure 104$c$ further includes a spacer bracing portion 110$c$ that serves to reinforce, or lock the spacer in place with the spacer retention feature.

Figure 7:
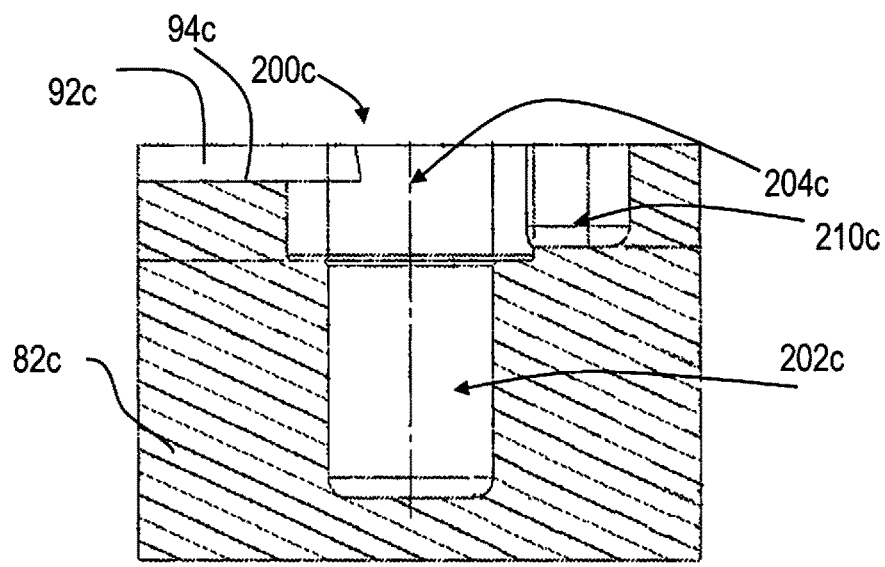
FIG. 7 is a cross-sectional view diagram of a wafer carrier having a wafer retention pocket and a spacer retention feature that includes bore sections according to one embodiment.

FIG. 7 is a cross-sectional view diagram of a wafer carrier having a wafer retention pocket 92$c$. Spacer retention feature 200$c$ includes bore sections 202$c$ and 204$c$. Bore section 202$c$ extends into body 82$c$ of the wafer carrier well below the bottom surface 94$c$ of wafer retention pocket 92$c$. Bore section 202$c$ is designed to engage post structure 102$c$. Likewise, a larger upper bore section 204$c$ is formed to engage head structure 104$c$. Upper bore section 204$c$ also extends down below the floor surface 94$c$. A portion of upper bore section 204$c$ also protrudes into wafer retention pocket 92$c$. This is the portion that includes wafer edge interface surface 106$c$ and wafer bottom support tab 108$c$. In this embodiment, spacer retention feature 200$c$ also includes spacer bracing cutout 210$c$ defined by the body 82$c$ of the wafer carrier, and situated along a radial axis from the center of wafer retention pocket 92$c$ on the distal end of spacer retention feature 200$c$. In an assembled wafer carrier, spacer bracing cutout 210$c$ engages with spacer bracing portion 110$c$.

Figure 8:
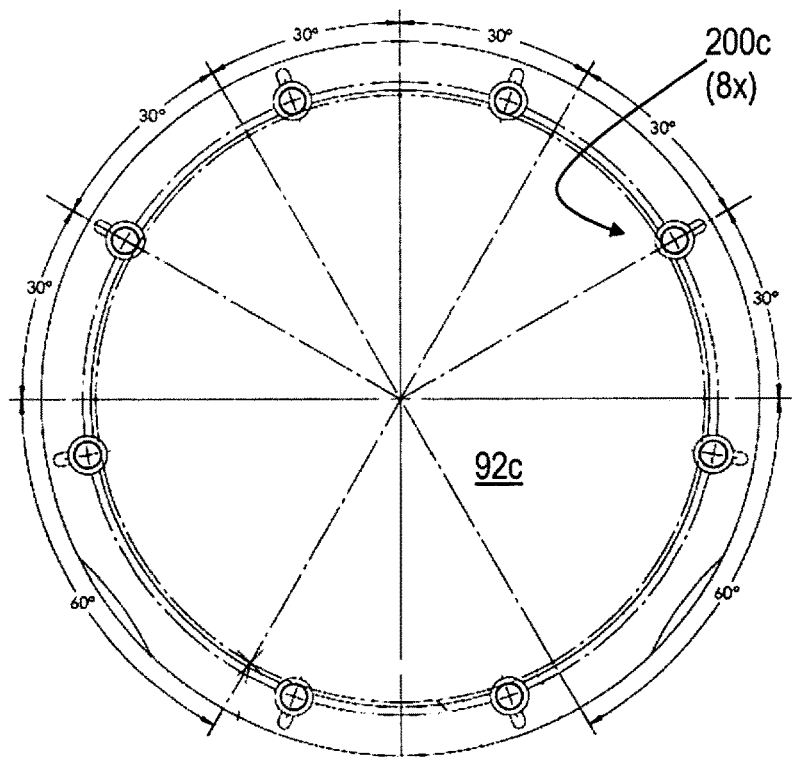
FIG. 8 is a top-view diagram illustrating an exemplary arrangement of a wafer carrier according to an embodiment in which wafer a retention pocket and a plurality of spacer retention features are shown.

FIG. 8 is a top-view diagram illustrating an exemplary arrangement of a wafer carrier according to a related embodiment in which wafer retention pocket 92$c$ and a plurality of spacer retention features 200$c$, are shown.

Spacer retention features 200c, are positioned around the periphery of pocket 92c in a non-uniform fashion, with a higher density of spacer retention features positioned at a distal end of pocket 92c relative to the central axis of the wafer carrier.

Figure 9:
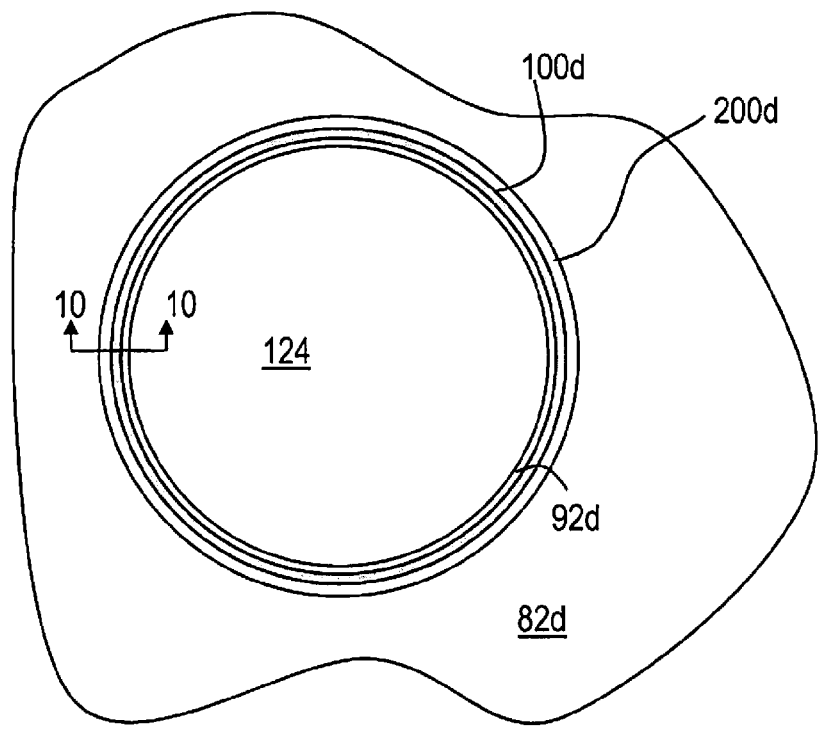
FIG. 9 is a top-view schematic diagram illustrating another type of geometry for a spacer according to one embodiment.
Figure 10:
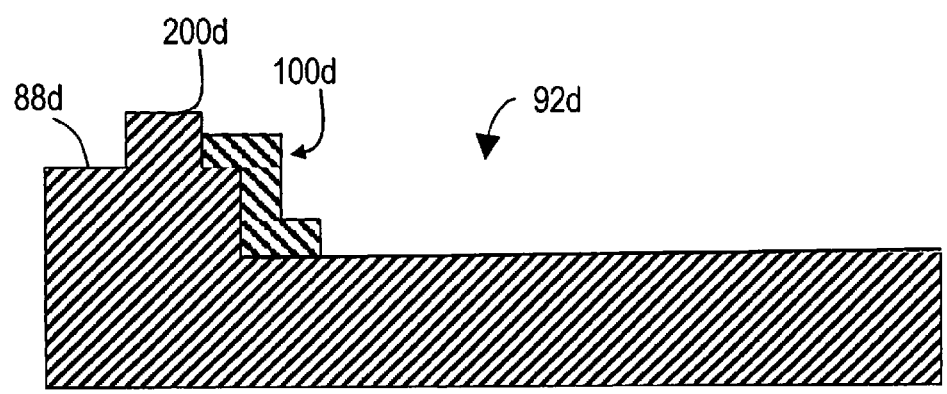
FIG. 10 is a cross-sectional view of a section in which a spacer retention feature is an upward protrusion according to one embodiment.

FIG. 9 is a top-view schematic diagram illustrating another type of geometry for spacer 100 according to one embodiment. As depicted, spacer 100d is a continuous, ring-shaped structure that is situated along a circumference of wafer retention pocket 92d. FIG. 10 is a cross-sectional view of section 10-10, in which spacer retention feature 200d is an upward protrusion similar to the embodiment of FIG. 5. As depicted in this embodiment, the profile of spacer 100d is generally Z-shaped. In a related embodiment, the interior surface of spacer retention feature 200d which engages with spacer 100d may be undercut (i.e., inwardly sloping) to help better retain the ring-shaped spacer 100d.

In other embodiments, any suitable profile may be used. Also, in other embodiments, the protrusion 200d may be omitted. In this latter case, the peripheral wall surface surrounding the floor surface of pocket 92d can function as a spacer retention feature.

Figure 11:
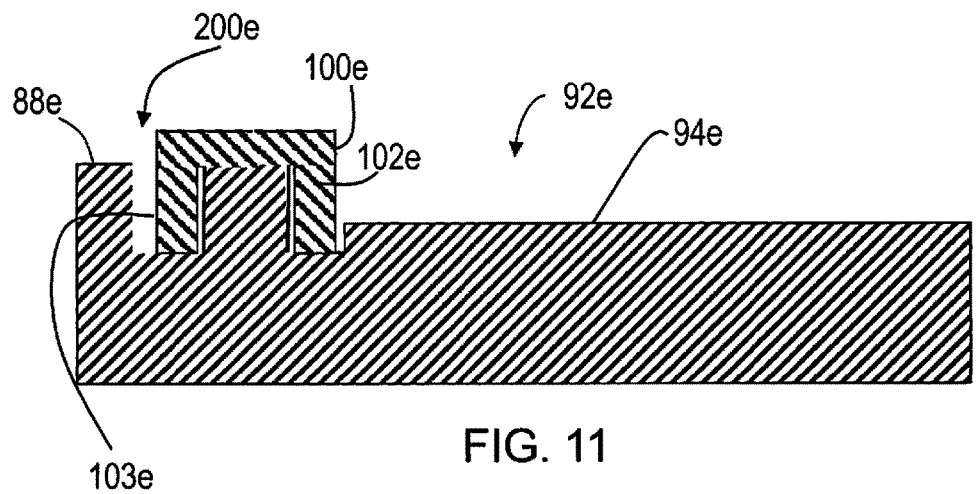
FIG. 11 is a schematic diagram depicting a variation of the embodiment of FIG. 10 where the spacer has a C-shaped profile according to one embodiment.

FIG. 11 is a schematic diagram depicting a variation of the embodiment of FIG. 10. In this example, spacer 100e is ring-shaped, and follows the contour of the wafer retention pocket as in the previous embodiment, but spacer 100e differs in that it has a C-shaped profile. A first portion 102e of the C-shaped spacer ring extends down into, or down past (as depicted) wafer retention pocket floor surface 94e. A second portion of the C-shaped profile 103e extends into trench 200e, which serves as a spacer retention feature in this embodiment.

Figure 12:
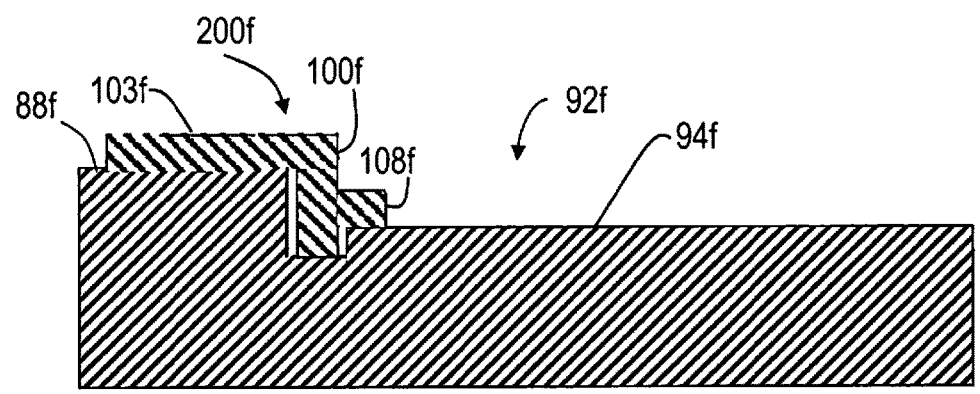
FIG. 12 is a diagram illustrating a spacer having a lateral extension portion that extends along the top surface of the wafer carrier to provide thermal insulating over portions of the top surface beyond the periphery of the wafer retention pocket according to one embodiment.

In a variation of this embodiment, as depicted schematically in FIG. 12, spacer 103f has a lateral extension portion 103f that extends along the top surface 88f of the wafer carrier to provide thermal insulating over portions of the top surface beyond the periphery of the wafer retention pocket 92f. This top-side insulation can be beneficial in avoiding temperature non-uniformities due to the blanketing effect. Essentially, extending the thermal insulation over the "web" areas of the wafer carrier creates a uniform blanket, thereby avoiding non-heat-insulating surfaces from which heat can be more easily emitted by radiation or transferred out by conduction or convection, resulting in cooler spots and hotter spots on the wafer during CVD processing. In a related embodiment, as depicted, spacer 100f includes a ledge portion 108f, which protrudes radially towards the center of the pocket 92f along pocket floor surface 94f. In this example the spacer retention feature 200f is embodied by the trench into which the deep portion of the spacer extends downward.

Figure 13A:
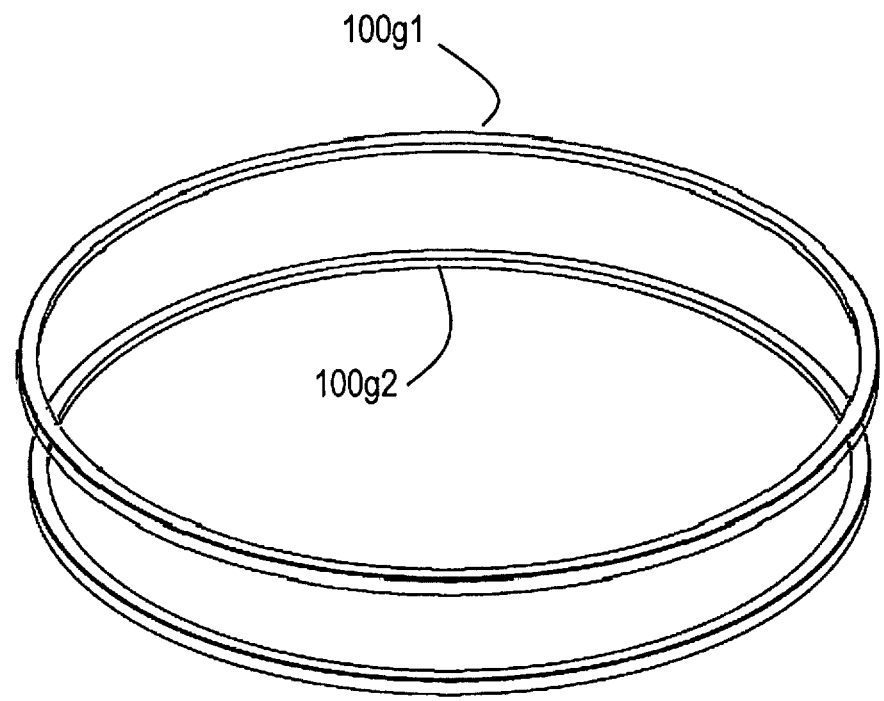
FIG. 13A is an exploded-view diagram illustrating another type of embodiment, where the spacer is realized as a compound structure comprising an upper ring spacer, and a lower ring spacer.

FIG. 13A is an exploded-view diagram illustrating another type of embodiment, where the spacer 100 is realized as a compound structure comprising an upper ring spacer 100g1, and a lower ring spacer 100g2. When assembled, the upper and lower ring spacers fit together in a nested fashion, as shown in more detail in the cross-sectional view diagram of a portion of the assembly in FIG. 13B. In this embodiment, each ring spacer 100g1, 100g2 has a generally L-shaped profile. The upper spacer 100g1 fits over the corner of the lower spacer 100g2 as depicted. The assembled rings are inserted into trench 200g, which has a depth substantially below that of wafer retention pocket floor surface 94g. In the assembly, lower spacer 100g2 provides a ledge 108g that extends around the circumference of the wafer retention pocket 92g. Upper ring spacer 100g1 provides a wafer edge interface surface 106g. The nested assembly of the upper and lower ring spacers is retained reliably in trench 200g thanks to the undercut of peripheral wall 96g. Likewise, the wafer is reliably retained by virtue of an undercut in wafer edge interface surface 106g.

Figure 13B:
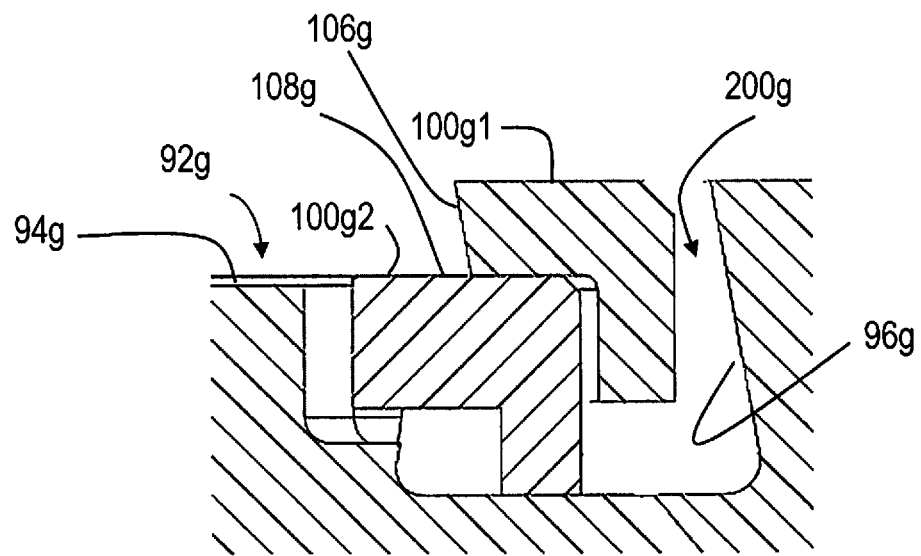
FIG. 13B is a cross-sectional view of a portion of the assembled parts depicted in FIG. 13A according to one embodiment.
Figure 14:
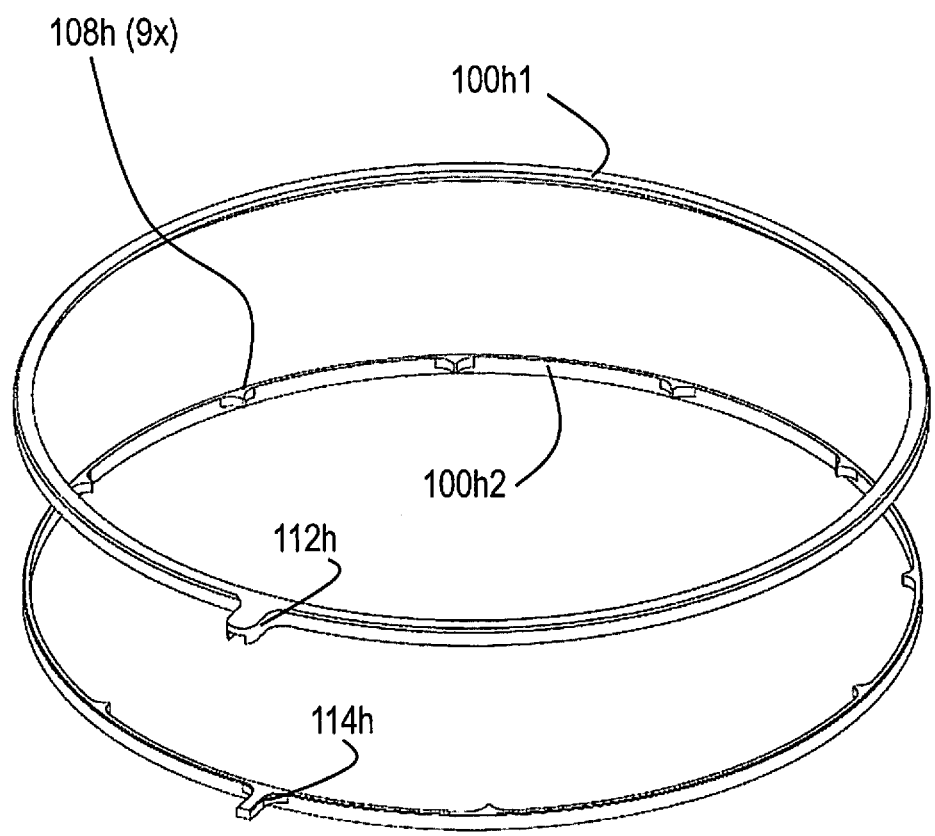
FIG. 14 is an exploded-view diagram that illustrates another type of compound spacer composed of an upper ring spacer and a lower ring spacer according to one embodiment.

As a variation to the embodiments described with reference to FIGS. 13A and 13B, FIG. 14 is an exploded-view diagram that illustrates a compound spacer composed of upper ring spacer 100h1 and lower ring spacer 100h2. Lower ring spacer 100h2 is similar to lower ring spacer 100g2 described above, except that lower ring spacer 100h2 has a plurality of tabs 108h situated along its interior wall. Tabs 108h protrude inwards, i.e., towards the center of the pocket, and serve to raise the wafer by its bottom surface (at its edges) off of the wafer retention pocket floor. This is an analogous function to ledge 108g, except that the group of tabs do not constitute a continuous ledge. Advantageously, for some applications, there is an opportunity for process gasses to flow beneath the wafer to some extent. Tabs 108h are arranged with increasing density (i.e., closer together) at the distal end of the pocket (i.e., farthest from the central axis on with the wafer carrier rotates in-process) since the distal end of the wafer is subjected to the greatest stresses due to the centrifugal force from high-speed rotation of the wafer carrier. In order to align the tabs 108h properly with respect to the wafer carrier's central axis, a set of keys, 112h and 114h, implemented in one embodiment as protrusions, engage with a notch in the wafer carrier's body (not shown). Since ring spacers 100h1 and 100h2 engage with one another, upper ring spacer 100h1 has a key 112h that fits over and engages with the key 114h of lower ring spacer.

Figure 15:
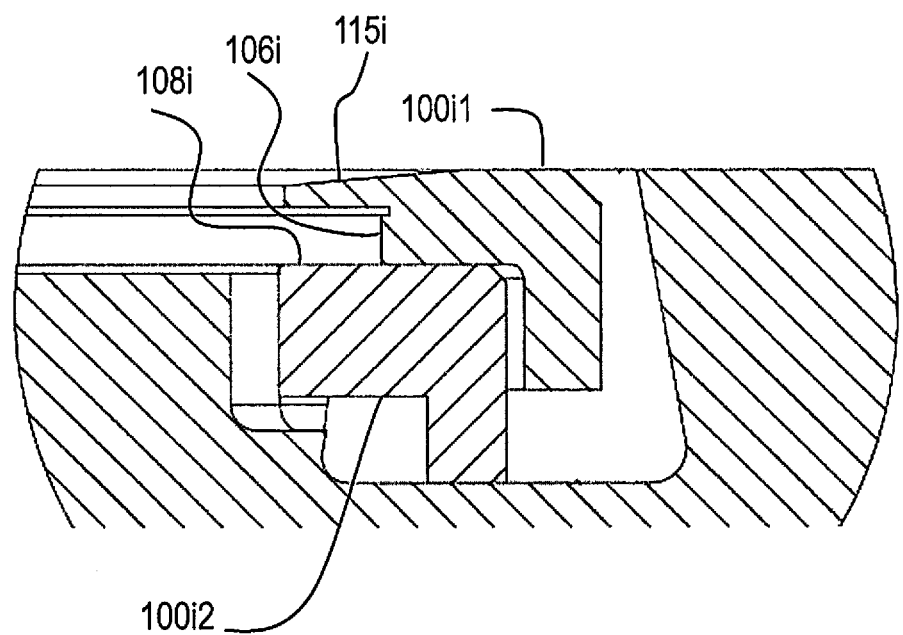
FIG. 15 is a cross-sectional view diagram illustrating another variation of the embodiment described with reference to FIGS. 13A and 13B.

FIG. 15 is a cross-sectional view diagram illustrating another variation of the embodiment described above with reference to FIGS. 13A and 13B. In the embodiment depicted in FIG. 15, lower ring spacer 100i2 is similar to lower ring spacer 100g2. It likewise provides a ledge 108i (or tabs), and is locked in place in nesting fashion by upper ring spacer 100i1. The primary difference lies in upper ring spacer 100i1. In particular, wafer edge interface surface 106i is not necessarily undercut (although it may be). Instead of relying on the undercut to retain the wafer reliably, a lip 115i extends towards the center of the pocket. With a wafer present in the pocket, lip 115i would reach over the top edge of the wafer. In this embodiment, the lip 115i is continuous along the entire circumference of upper ring spacer 100i. In a related embodiment, the lip 115i is in the form of tabs at various locations around the circumference; i.e., there is no continuous lip. Lip 115i prevents the wafer from being ejected from the wafer retention pocket by opposing upward movement of the wafer edge.

Figure 16:
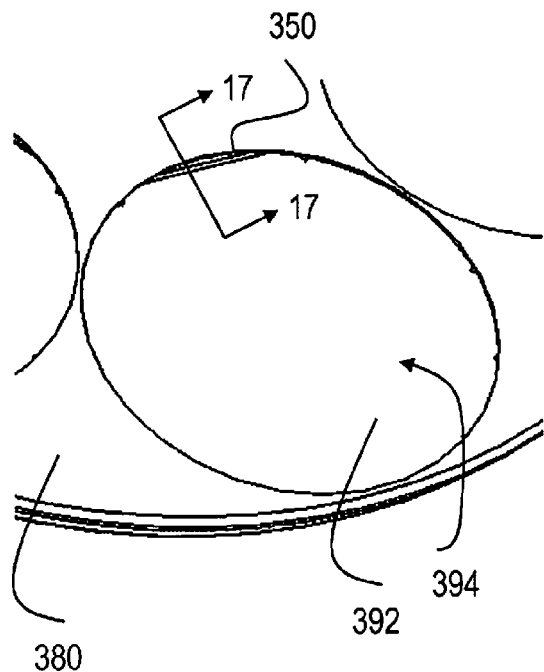
FIG. 16 is a diagram illustrating provisions for improving wafer edge-to-edge heating uniformity for wafers that have one or more flat edges according to one type of embodiment.

In a related aspect of the invention, provisions are made for improving wafer edge-to-edge heating uniformity for wafers that have one or more flat edges, or flats. FIG. 16 is a diagram illustrating an approach according to one type of embodiment. Wafer carrier 380 has a wafer retention pocket 392 recessed from the top surface like a conventional wafer carrier; however, the floor surface 394 is specially modified to increase heat transfer to the flat edge of the wafer. In particular, flat compensation portion 350 of the pocket floor is sloped downward from the pocket's periphery towards the center of the pocket for some distance corresponding to the size of the flats of the wafers for which wafer carrier 380 is designed.

Figure 17A:
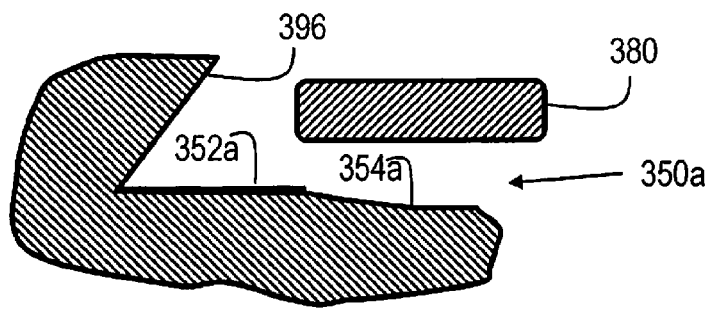
FIGS. 17A and 17B are cross-sectional views of the provisions depicted in FIG. 16.
Figure 17B:
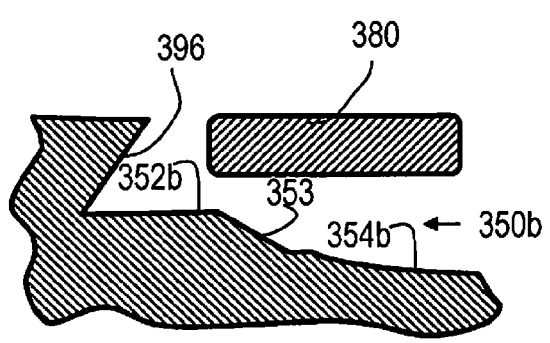

FIGS. 17A and 17B are cross-sectional view diagrams of section 17-17 from FIG. 16. FIG. 17A illustrates an interior peripheral pocket wall 396, adjacent to which is a flat compensation portion 350a that includes a raised flat pocket floor portion 652a, which after some distance takes the form of a concave downward curved profile. In one embodiment, the transition point between the flat and concave parts is based on the position of the flat edge of wafer 380. For example, in one embodiment, the transition is situated directly below the flat edge of the wafer.

FIG. 17B illustrates a similar embodiment, though with three sections of the floor portions: flat section 352b, linearly-sloping section 353, and concave-sloping section 354b. The relative positions of each of the sections can be optimized based on empirical data from process runs, and the photoluminescence variability produced in each run.

Figure 18:
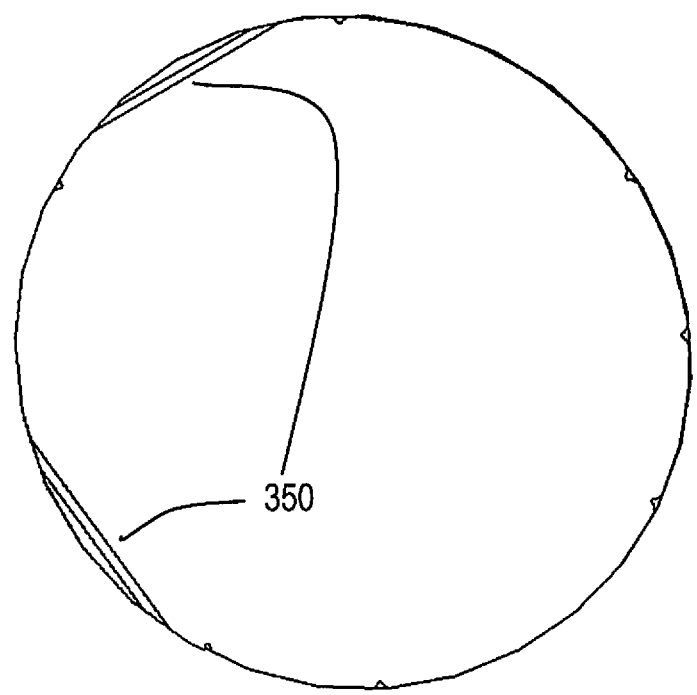
FIG. 18 is a schematic diagram illustrating, in top view, a wafer retention pocket designed to accommodate a wafer with two flats according to one embodiment.

FIG. 18 is a schematic diagram illustrating, in top view, a wafer retention pocket designed to accommodate a wafer with two flats. Here, there are two flat compensation portions aligned according to the wafer flat alignment on the wafer.

Figure 19:
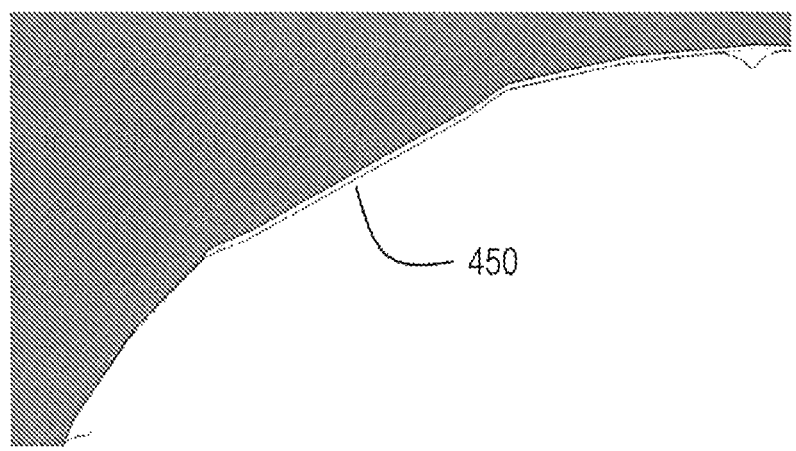
FIG. 19 illustrates another approach for improving heating uniformity for wafers having a flat according to another embodiment.

FIG. 19 illustrates another approach, namely, use of a non-round pocket. In this example, a generally flat peripheral wall portion 450 is designed to coincide with the wafer flat. This approach maintains essentially the same distance between the wafer flat and the peripheral wall of the pocket as every other point along the wafer's edges. In a related approach, the generally flat wall portion 450 is not actually perfectly flat. Instead, there is a slight convex curvature of a very large radius. This creates a protrusion of the peripheral wall towards the center of the pocket. The geometry facilitates removal of the wafer from the pocket following processing, since it avoids binding of the wafer's edges against the peripheral wall, which can happen if the wafer becomes forced into the corner at the transition between the curved peripheral wall and the generally flat wall portion 450.

Figure 20:
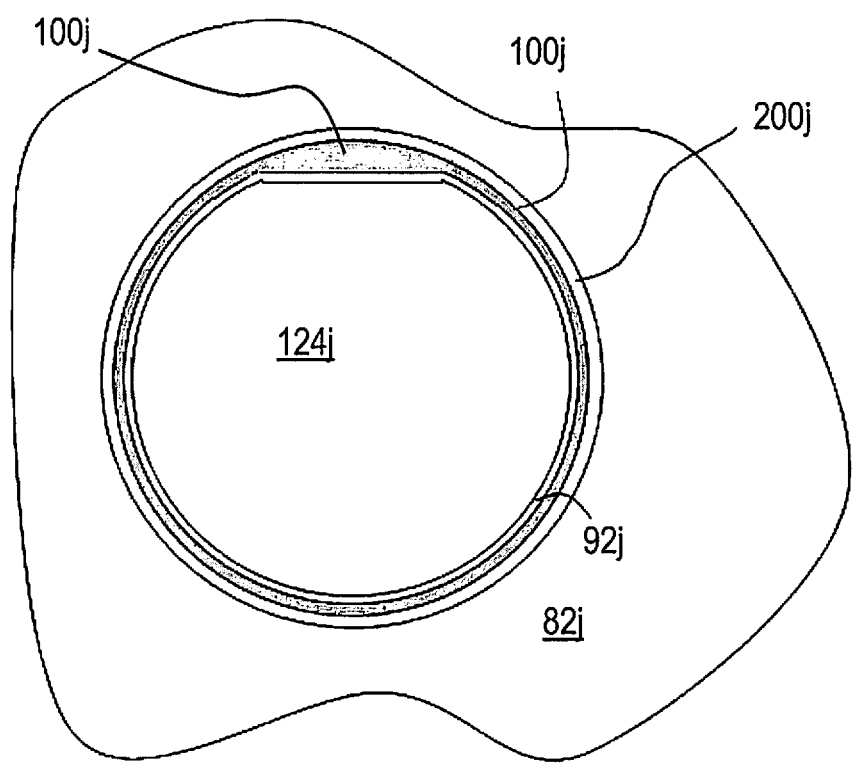
FIG. 20 is a top-view schematic diagram illustrating another type of geometry for a spacer according to one embodiment in which the spacer is used to accommodate wafer flats.

FIG. 20 is a top-view schematic diagram illustrating another type of geometry for a spacer 100 according to one embodiment in which the spacer 100 is used to accommodate wafer flats. As depicted, spacer 100j is a continuous, ring-shaped structure that has a flat interior portion 101j that is meant to coincide with the wafer flat of wafer 124j. Spacer 100j is situated along a circumference of round wafer retention pocket 92j. Since the outer circumference of ring-shaped spacer 100j is round, spacer 100j can be placed in any orientation according to one embodiment. In a related embodiment, a key-and notch feature is utilized to require a certain orientation of the wafer flat. In this embodiment, the thermally-insulating properties of spacer 100j obviate any non-uniformities experienced at the flat edge of wafer 124j due to spacing between wafer edge and pocket periphery. This approach is not mutually exclusive of the embodiments of FIGS. 16-18. Thus, it can be combined with flat compensation portion 350 of the pocket floor in some embodiments.

The embodiments above are intended to be illustrative and not limiting. Other variations are contemplated to fall within the claims. In addition, although aspects of the present invention have been described with reference to particular embodiments, those skilled in the art will recognize that changes can be made in form and detail without departing from the scope of the invention, as defined by the claims.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as will be understood by persons of ordinary skill in the art.

Any incorporation by reference of documents above is limited such that no subject matter is incorporated that is contrary to the explicit disclosure herein. Any incorporation by reference of documents above is further limited such that no claims that are included in the documents are incorporated by reference into the claims of the present application. The claims of any of the documents are, however, incorporated as part of the disclosure herein, unless specifically excluded. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A wafer carrier assembly for use in a system for growing epitaxial layers on one or more wafers by chemical vapor deposition (CVD), the wafer carrier assembly comprising:
   a wafer carrier body formed symmetrically about a central axis, and including a generally planar top surface that is situated perpendicularly to the central axis;
   at least one wafer retention pocket recessed in the wafer carrier body from the top surface, each of the at least one wafer retention pockets including a floor surface extending in a direction generally parallel to the generally planar top surface and a peripheral wall surface extending from the floor surface to the top surface in a direction generally perpendicular to the floor surface, the peripheral wall surface circumscribing the floor surface and defining a periphery of that wafer retention pocket, the wafer retention pocket being adapted to retain a wafer within the periphery when subjected to rotation about the central axis; and
   the wafer retention pocket having a generally flat peripheral wall portion and a rounded wall portion to accommodate a wafer having at least one flat edge, wherein a portion of the floor surface adjacent to the generally flat peripheral wall portion has a raised portion that is less recessed from the top surface than portions of the floor surface adjacent to the rounded wall portion of the wafer retention pocket.

2. The wafer carrier assembly of claim 1, wherein the raised portion of the floor surface includes a flat portion.

3. The wafer carrier assembly of claim 1, wherein the portion of the floor surface over which the at least one flat edge of the wafer is retained includes a downward slope from the periphery of the wafer retention pocket to a center of the wafer retention pocket.

4. The wafer carrier assembly of claim 3, wherein the downward slope portion of the floor surface includes a concave downward sloping portion.

5. The wafer carrier assembly of claim 3, wherein the downward slope portion of the floor surface includes a linear downward sloping portion.

6. The wafer carrier assembly of claim 3, wherein the peripheral wall surface of the wafer retention pocket includes at least one generally flat portion configured to coincide with the at least one flat edge of the wafer to be retained.

7. A wafer carrier assembly for use in a system for growing epitaxial layers on one or more wafers by chemical vapor deposition (CVD), the wafer carrier assembly comprising:
- a wafer carrier body formed symmetrically about a central axis, and including a generally planar top surface that is situated perpendicularly to the central axis;
- at least one wafer retention pocket recessed in the wafer carrier body from the top surface, each of the at least one wafer retention pocket including a floor surface extending in a direction generally parallel to the top surface and a peripheral wall surface extending from the floor surface to the top surface in a direction generally perpendicular to the floor surface, the peripheral wall surface circumscribing the floor surface and defining a periphery of that wafer retention pocket, the wafer retention pocket being adapted to retain a wafer within the periphery when subjected to rotation about the central axis via a generally flat peripheral wall portion and a rounded wall portion; and
- the wafer retention pocket being further configured to accommodate a wafer having at least one flat edge, wherein the wafer retention pocket includes an inserted spacer situated along the peripheral wall, and defining an interior periphery that coincides with the at least one generally flat peripheral wall portion.

8. The wafer carrier assembly of claim 7, wherein the inserted spacer includes a ring-shaped structure having a circular outer periphery that is adapted to be received in the wafer retention pocket that is circular, and includes at least one flat interior portion that coincides with the at least one flat edge of the wafer.

9. The wafer carrier assembly of claim 7, wherein the inserted spacer is formed from a material having thermally-insulating properties relative to the wafer carrier body.

10. A wafer carrier assembly for use in a system for growing epitaxial layers on one or more wafers by chemical vapor deposition (CVD), the wafer carrier assembly comprising:
- a wafer carrier body formed symmetrically about a central axis, and including a generally planar top surface that is situated perpendicularly to the central axis;
- at least one wafer retention pocket recessed in the wafer carrier body from the top surface, each of the at least one wafer retention pocket including a floor surface extending generally parallel to the top surface and a peripheral wall surface extending from the floor surface to the top surface in a direction generally perpendicular to the flat floor surface, the peripheral wall surface circumscribing the floor surface and defining a periphery of that wafer retention pocket, the wafer retention pocket being adapted to retain a wafer within the periphery when subjected to rotation about the central axis via a generally flat peripheral wall portion and a rounded wall portion, the generally flat peripheral wall portion having a convex curvature protruding into that wafer retention pocket; and
- the at least one wafer retention pocket being further configured to accommodate a wafer having at least one flat edge at the generally flat peripheral wall portion, wherein the generally flat portion is configured to coincide with the at least one flat edge of the wafer to be retained.

11. The wafer carrier assembly of claim 10, wherein a portion of the floor surface over which the at least one flat edge of the wafer is retained has a raised portion that is less recessed than portions of the floor surface situated beneath rounded edge portions of the wafer.

12. A wafer carrier assembly for use in a system for growing epitaxial layers on one or more wafers by chemical vapor deposition (CVD), the wafer carrier assembly comprising:
- a wafer carrier body formed symmetrically about a central axis, and including a generally planar top surface that is situated perpendicularly to the central axis;
- at least one wafer retention pocket recessed in the wafer carrier body from the top surface, each of the at least one wafer retention pocket including a floor surface extending parallel to the top surface and a peripheral wall surface extending from the floor surface to the top surface in a direction generally perpendicular to the floor surface, the peripheral wall surface having a generally flat peripheral wall portion and a rounded wall portion and arranged to circumscribe the floor surface and define a periphery of that wafer retention pocket, the wafer retention pocket being adapted to retain a wafer within the periphery when subjected to rotation about the central axis;
- a thermally-insulating spacer situated at least partially in the at least one wafer retention pocket and arranged to maintain a spacing between the peripheral wall surface and the wafer, the spacer being constructed from a material having a thermal conductivity less than a thermal conductivity of the wafer carrier body such that the spacer limits heat conduction from portions of the wafer carrier body to the wafer; and
- a spacer retention feature formed in the wafer carrier body that engages with the spacer and includes a surface oriented to prevent centrifugal movement of the spacer when subjected to rotation about the central axis.

13. The wafer carrier assembly of claim 12, wherein the spacer and the spacer retention feature cooperate to form a bracing arrangement that locks the spacer in place in response to an applied centrifugal force along an outward radial direction from the central axis.

14. The wafer carrier assembly of claim 12, wherein the spacer is arranged to maintain an air gap spacing between the floor surface and the wafer.

15. The wafer carrier assembly of claim 12, wherein the spacer includes a lateral extension portion that extends along the top surface of the wafer carrier to provide thermal insulating over portions of the top surface beyond the periphery of the wafer retention pocket.

16. The wafer carrier assembly of claim 12, wherein the spacer includes compound structure comprising a lower portion and an upper portion, wherein the upper portion engages with the lower portion and with the spacer retention feature to brace the lower and upper portions in response to an applied centrifugal force along an outward radial direction from the central axis.

17. The wafer carrier assembly of claim 16, wherein the upper portion provides a wafer edge interface surface that exerts a centripetal force on an edge of the wafer in a direction towards the central axis during rotation of the wafer carrier assembly.

18. The wafer carrier assembly of claim 12, wherein the spacer includes at least one ring structure situated along the periphery of the wafer retention pocket, and wherein the at least one ring structure includes a plurality of tabs that protrude towards a center of the wafer retention pocket, the tabs being arranged such that, in operation, each tab supports a wafer from a bottom surface of the wafer, and wherein gaps between successive tabs permit gas to flow beneath the wafer.

19. The wafer carrier assembly of claim 12, wherein the spacer includes at least one ring structure situated along the periphery of the wafer retention pocket, and wherein the at least one ring structure includes a lip that protrudes towards a center of the wafer retention pocket, the lip being arranged such that, in operation, the lip retains a wafer in the wafer retention pocket from a top surface of the wafer.

20. The wafer carrier assembly of claim 12, wherein the spacer includes at least one ring structure situated along the periphery of the wafer retention pocket, and wherein the at least one ring structure includes an outer periphery that conforms to the wafer retention pocket periphery, and an inner wall that includes a flat portion adapted to conform around a wafer having a flat edge.

* * * * *